United States Patent

Bakhit et al.

[11] Patent Number: 5,998,291
[45] Date of Patent: Dec. 7, 1999

[54] ATTACHMENT METHOD FOR ASSEMBLY OF HIGH DENSITY MULTIPLE INTERCONNECT STRUCTURES

[75] Inventors: Gabriel G. Bakhit, Huntington Beach; George Averkiou, Upland, both of Calif.

[73] Assignee: Raytheon Company, Lexington, Mass.

[21] Appl. No.: 08/845,633

[22] Filed: Apr. 7, 1997

[51] Int. Cl.[6] ............................................ H01L 21/4763
[52] U.S. Cl. .................... 438/618; 438/107; 438/622; 438/455; 216/20
[58] Field of Search .................... 438/455, 464, 438/624, 622, 618, 626, 644, 652, 654, 457, 458, 629, 107, 108, 106; 216/20

[56] References Cited

U.S. PATENT DOCUMENTS

| | | | |
|---|---|---|---|
| 5,192,716 | 3/1993 | Jacobs | 29/832 |
| 5,262,351 | 11/1993 | Bureau et al. | 257/81 |
| 5,514,613 | 5/1996 | Santadrea et al. | 438/62 |
| 5,691,245 | 11/1997 | Bakhit et al. | 216/20 |
| 5,877,034 | 3/1999 | Ramm et al. | 438/15 |

*Primary Examiner*—Carl Whitehead, Jr.
*Assistant Examiner*—Khanh Dvong
*Attorney, Agent, or Firm*—Leonard A. Alkov; William C. Schubert; Glenn H. Lenzen, jr.

[57] ABSTRACT

Method of fabricating high density multilayer interconnect structures or flexible HDMI decals. The methods secure a top surface of an HDMI decal fabricated on a rigid substrate to a protective film layer which is in turn adhesively secured to a flat carrier. This structure is then demounted or delaminated from the rigid substrate. The bottom of the HDMI decal, with the protective film layer and flat carrier attached thereto, is secured to a mounting substrate using a relatively thick adhesive layer. After the HDMI decal is adhesively secured to the mounting substrate, the carrier and protective film layer are removed. The top surface of the HDMI decal thus remains flat after it is secured to the mounting substrate, and therefore connection of integrated circuit chips to contact pads on the top surface of the decal is ensured because this surface is flat. The carrier and protective film layer also protects the top surface of the decal while it is secured to the mounting substrate.

12 Claims, 3 Drawing Sheets

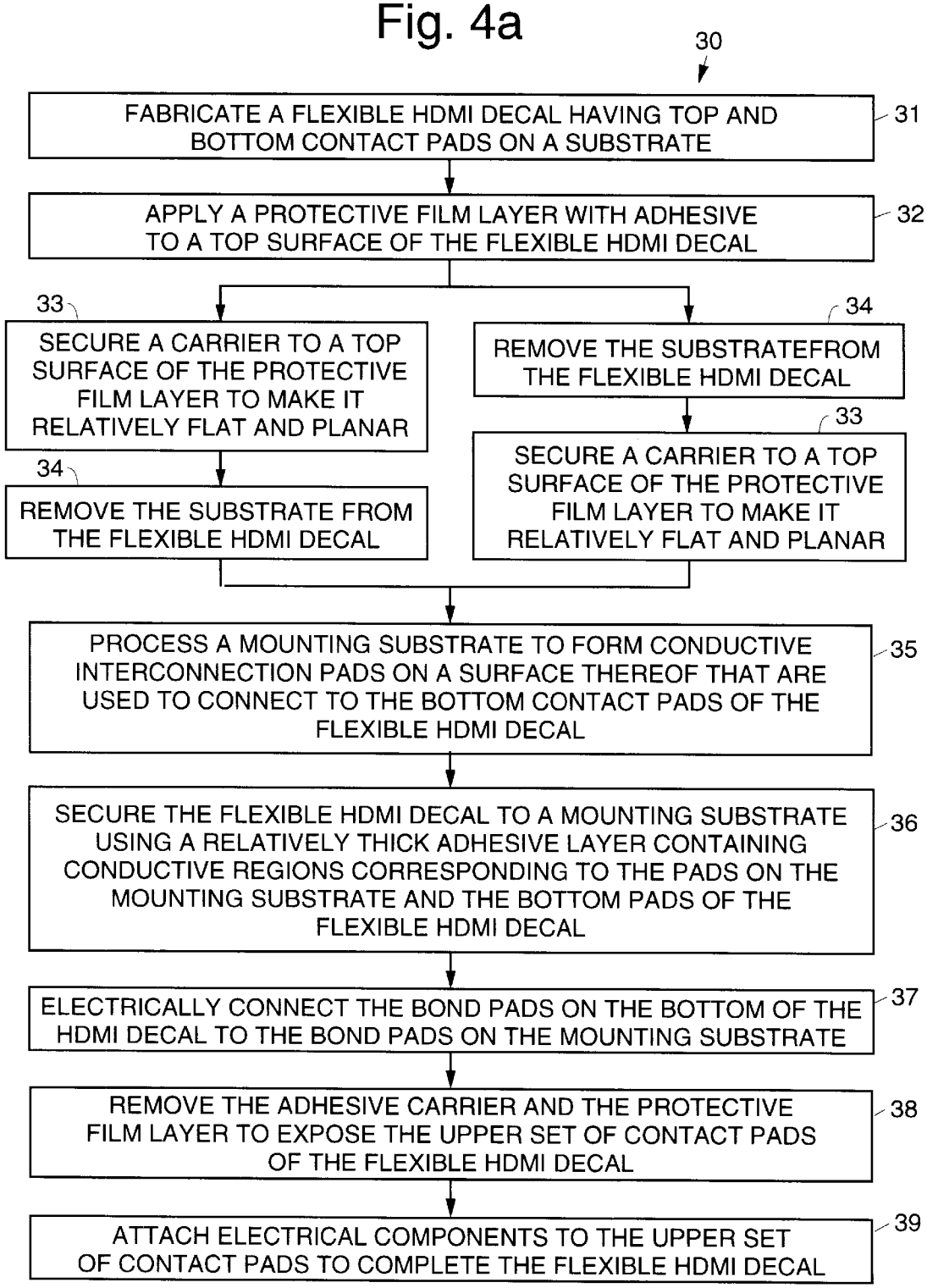

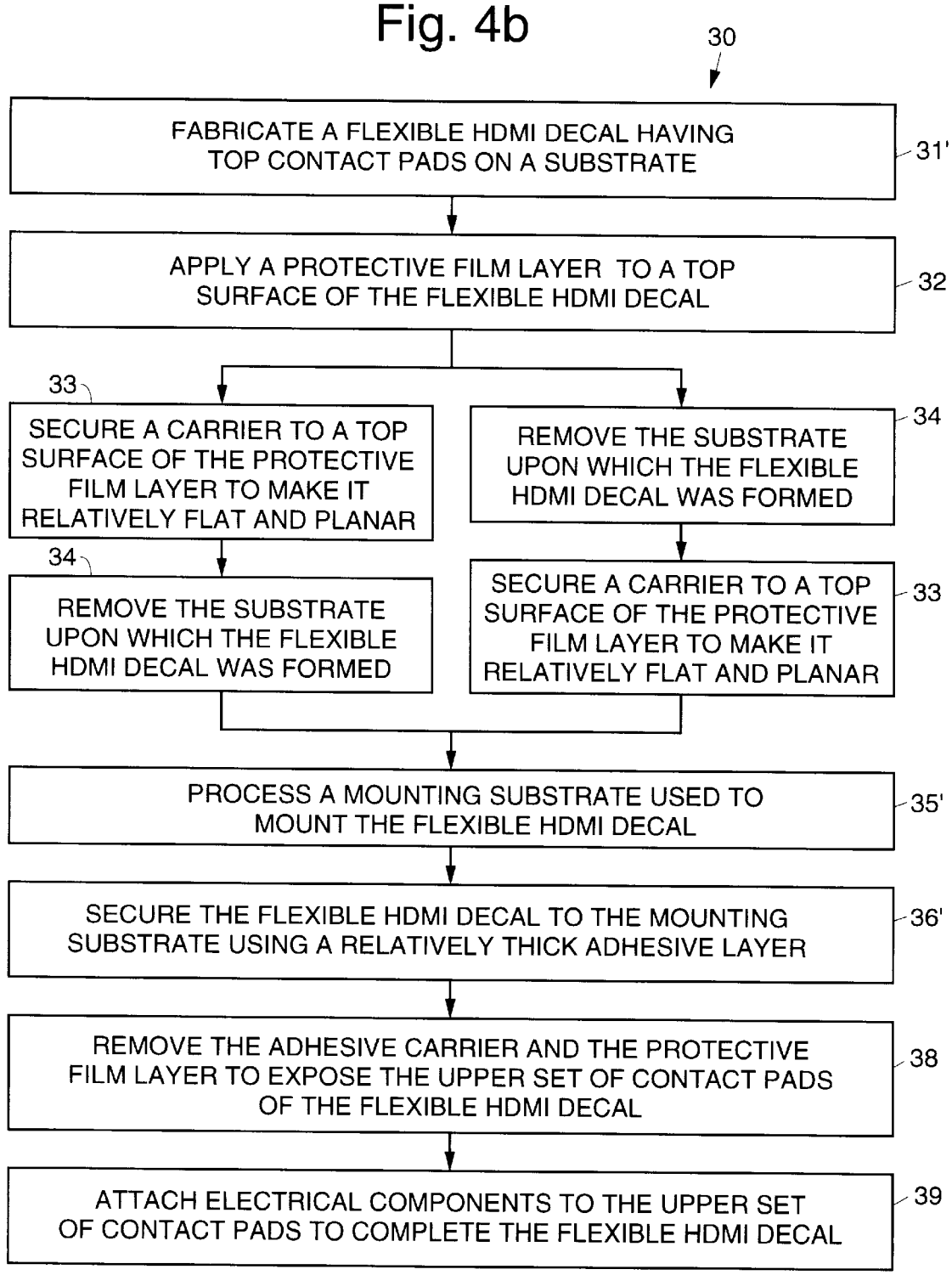

ATTACHMENT METHOD FOR ASSEMBLY OF HIGH DENSITY MULTIPLE INTERCONNECT STRUCTURES

BACKGROUND

The present invention relates generally to high density multilayer interconnect (HDMI) structures, and more particularly, to an attachment method for assembling flexible HDMI decals comprising flexible fine line interconnect structures.

U.S. Pat. No. 5,699,245, entitled "Methods of Forming Two-Sided HDMI Interconnect Structures", assigned to the assignee of the present invention, discloses methods of forming double-sided high density multilayer interconnect structures. These inventions produce single- and double-sided HDMI structures that are useful in producing interconnection substrates for electronic components, three-dimensional flexible cables, membrane IC test boards and power devices, and the like that require fine line metallized conductors. The present invention improves upon these particular inventions.

No prior art is known that specifically relates to the present invention. An alternative to the present invention is to not use a protective film on the top surface of the HDMI decal. This structure would be subject to problems that the present invention avoids. More specifically, the top surface of the HDMI decal would not be flat after mounting to a carrier substrate which causes problems when mounting integrated circuit chips to the top surface of the HDMI decal, and adhesive bleedout could encroach onto the top surface of the decal preventing electrical connection of the decal to its mounting substrate. The protective film also serves to prevent mechanical damage to the top of the HDMI decal during delamination of the HDMI decal from the substrate and through the decal mounting process.

Consequently, it is an objective of the present invention to provide for an improved attachment method for assembling flexible HDMI structures that provides a flat surface for mounting integrated circuit chips. It is also an objective of the present invention to provide for an improved attachment method for assembling flexible HDMI structures that eliminates problems of adhesive bleedout encroaching onto the top surface of the decal which would prevent electrical connection of the decal to its mounting substrate. It is an additional objective of the present invention to protect the top of the HDMI decal from mechanical damage.

SUMMARY OF THE INVENTION

To meet the above and other objectives, the present invention secures a protective film layer to a front side (or top surface) of an HDMI decal fabricated on a rigid substrate, and a flat carrier is in turn secured to the protective film layer. The HDMI decal with the protective film layer and flat carrier attached thereto is then demounted or delaminated from the substrate. The bottom surface of the HDMI decal, with the protective film layer and flat carrier attached thereto, is then secured to a mounting substrate. The mounting substrate may not be perfectly flat, and in general it is not. The HDMI decal is secured to the mounting substrate using a relatively thick adhesive layer or a sheet of adhesive. After the HDMI decal is secured to the mounting substrate, the flat carrier and protective film layer are removed. The top surface of the HDMI decal remains flat after it is mounted to the mounting substrate, and therefore connection of integrated circuit chips to the top surface of the decal is ensured.

The present methods provide significant benefits in the handling of HDMI decals and in the subsequent assembly processes used to mount the decals for assembly. A major advantage of the present invention is that it maintains the flatness of the top of the decal for connection of integrated circuit chips even when the decal is mounted on a non-planar surface or substrate. Additionally the present invention protects the top of the decal from deleterious intrusion of mounting adhesive. The present method may be used with both top contact HDMI decals and to bottom array contact HDMI decals, such as those disclosed in the above-cited patent.

Thin HDMI decals are very flexible and difficult to handle. The present invention provides for additional stiffness of the decal in addition to providing protection for chip connection pads on the top of the decal. The present invention maintains the flatness of the top of the decal which provides a level surface for chip connection. This is particularly important during the attachment of the decal to a substrate using adhesives. The present invention protects the decal from adhesive bleedout or smear during attachment. The present invention also protects the top surface of the decal during processing that modifies bottom pad metallization to form solderable contacts. The ability to attach a HDMI decal to a mounting substrate having a lower interconnection density provides cost savings for electronic modules that employ the HDMI decals. The present invention may be used in military, and space, commercial and automotive applications.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIGS. 4a and 4b are flow charts illustrating methods in accordance with the principles of the present invention.

DETAILED DESCRIPTION

Figure 1:
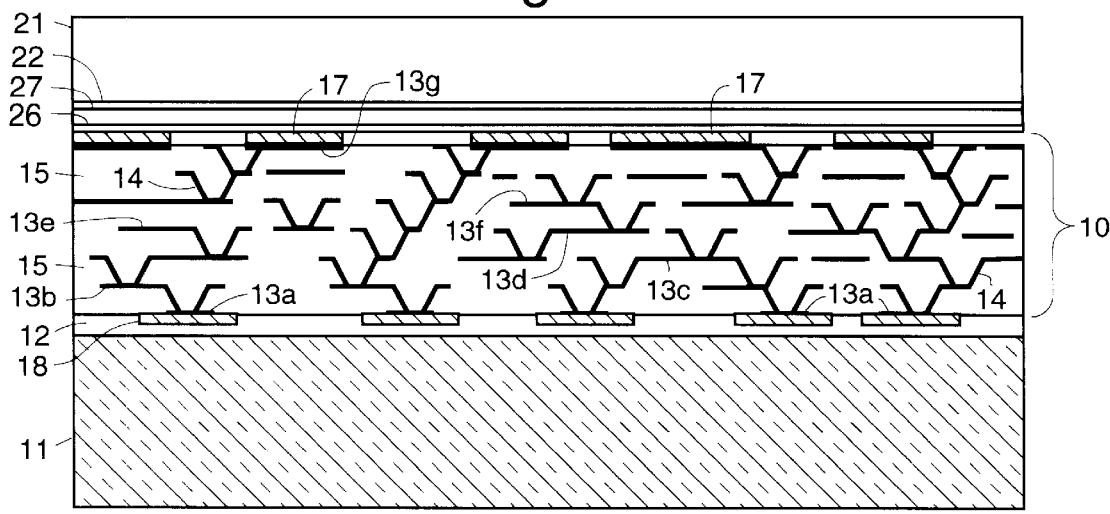
FIGS. 1–3 are cross sectional side views showing fabrication of a flexible high density multilayer interconnect structure using methods in accordance with the principles of the present invention.
Figure 2:
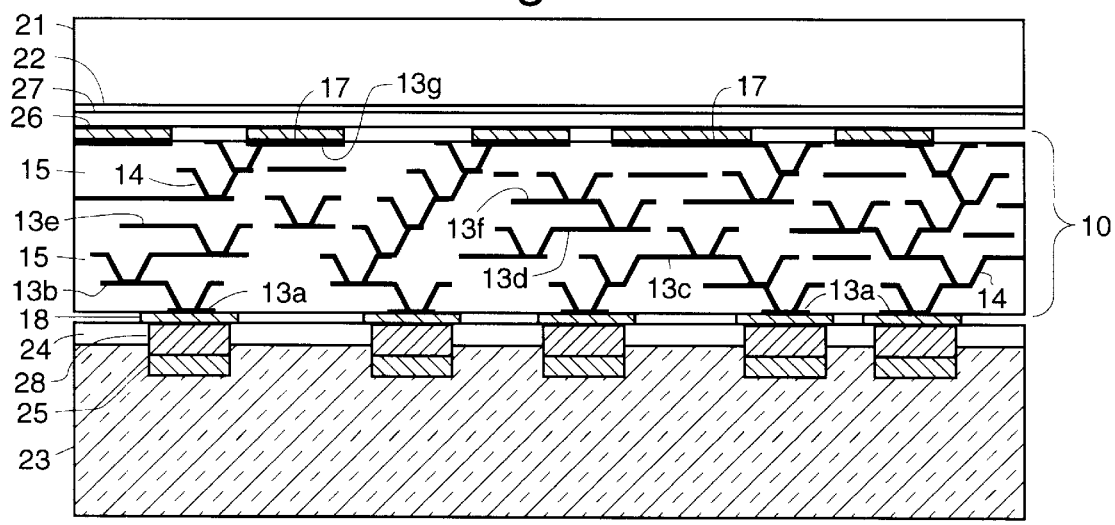
Figure 3:
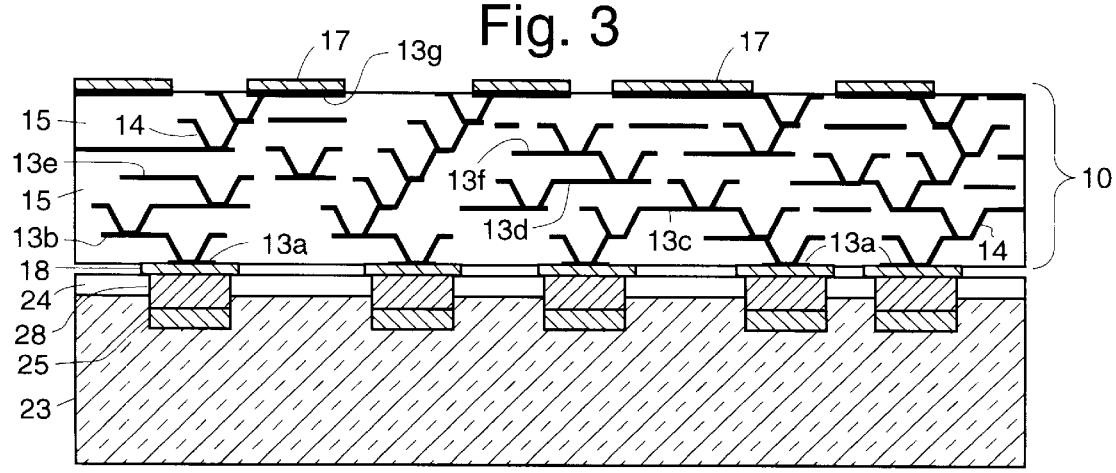

Referring to the drawing figures, FIGS. 1–3 are cross sectional side views showing fabrication of flexible high density multilayer interconnect structures 10 or flexible HDMI decals 10 using methods 30 in accordance with the principles of the present invention. The HDMI decal 10 may be fabricated using processes disclosed in U.S. Pat. No. 5,034,091 and U.S. Pat. No. 5,311,404, in addition to methods disclosed in the above-cited U.S. Patent entitled "HDMI Decal and Fine Line Flexible Interconnect Forming Methods", for example, all of which are assigned to the assignee of the present invention. The techniques disclosed in these references may be used to produce the multilayer interconnect structures 10 on a rigid non-UV or non-laser absorbing substrate 11.

The flexible HDMI structure 10 is fabricated on a relatively large rigid substrate 11, typically having dimensions on the order of two feet by two feet. The substrate 11 may comprise an ultraviolet transparent substrate 11 or wafer 11, such as quartz, for example, or may comprise a silicon or metal, for example, depending upon the release technique that is to be used to remove or release the flexible HDMI interconnect structures 10 from the substrate 11.

The substrate 11 has a release layer 12 formed or otherwise deposited thereon. When the ultraviolet transparent rigid substrate 11 is used, a polyimide layer 12 is deposited as the release layer 12. When a silicon substrate 11 is used, a metal or silicon dioxide layer 12 is deposited as the release layer 12. The metal release layer 12 may be comprised of titanium or tungsten, for example.

The flexible HDMI structure 10 has a plurality of dielectric layers 15 having fine line metallization patterns 13 and vias 14 formed therein that terminate at an upper set of contact pads 17 on a top surface of the structure 10. The fine line metallization patterns 13 may include a bottom contact pad layer 13a, pad routing layers 13b, a ground layer 13c, an X-direction signal layer 13d, a Y-direction signal layer 13e, a power layer 13f and an upper contact pad layer 13g. The upper contact pad layer 13g has contact pads 17 coupled thereto that are used to connect to electronic components (not shown).

In accordance with the present invention, a protective film 26 having an adhesive layer 27 on one surface thereof, for example, is uniformly adhered to the top surface of the flexible HDMI structure 10. A carrier 21 having an adhesive layer 22 on one surface thereof, for example, is secured to the top surface of the protective film 26. The protective film 26 is used to protect the top surface of the flexible HDMI structure 10 and the carrier 21 is used to ensure that the top surface of the flexible HDMI structure 10 remains flat.

For example, each of the HDMI structures 10 may comprise dielectric layers 15 comprising polyimide having aluminum fine line interconnects 13 and vias 14 formed therethrough that provide signal paths from the upper set of contact pads 17 disposed at the surface of HDMI structure 10 to the bottom contact pad layer 13a. The bottom contact pad layer 13a is connected to a bottom set of contact pads 18 that are used to connect to bond pads 28 attached to conductive lines 25 (or a ground plane 25) on a mounting carrier 23 (shown in FIG. 2). The plurality of HDMI structures 10 are typically formed on the substrate 11 and release layer 12 using well-known MCM-D processing techniques. Processing that may be used to fabricate the two-sided HDMI structures 10 is described in U.S. Pat. No. 5,034,091, entitled "Method of Forming an Electrical Via Structure", and assigned to the assignee of the present invention, which is incorporated herein by reference in its entirety.

Subsequent to fabrication of the HDMI structures 10, the release layer 12 is processed to release or remove one or more fabricated HDMI interconnect structures 10 from the substrate 11. Once the HDMI structures 10 are formed, in the case where the ultraviolet transparent rigid substrate 11 is used, a short wavelength ultraviolet radiation source (not shown), which is programmable and controlled, is used to release individual HDMI structures 10. The protective film 26 and its adhesive layer 27, and the carrier 21 and its adhesive layer 22 remain secured to the flexible HDMI structure 10 after release or delamination of the flexible HDMI structure 10 from the substrate 11 and serve to keep it flat during the remaining processing.

Alternatively, a flood beam ultraviolet radiation source may be used to release many or all of the HDMI structures 10 from the ultraviolet transparent substrate 11. The ultraviolet radiation source is caused to radiate ultraviolet radiation through the ultraviolet transparent substrate 11 and onto the release layer 12. For example, an ultraviolet laser may be used to selectively irradiate one of the HDMI structures 10 to release it from the release layer 12.

The ultraviolet radiation (photons) from the ultraviolet radiation source interacts with the polyimide release layer 12 adjacent to the ultraviolet transparent substrate 11 and ruptures or otherwise breaks the adhesive bond therebetween. This permits the HDMI structures 10 to be lifted off of the ultraviolet transparent substrate 11. Multiple HDMI structures 10 may be released from the ultraviolet transparent substrate 11 using a wide area ultraviolet radiation source in a similar manner.

In cases where the substrate 11 comprises silicon, a titanium or tungsten metal layer 12, or a silicon dioxide layer 12 is used as the release layer 12. An appropriate wet etching procedure is used to totally release the HDMI structures 10 from the release layer 12. Wet etching procedures are well known to those skilled in the art that will release the HDMI structures 10.

The release layer 12 of the flexible HDMI structure 10 is processed to expose the bond pads on its bottom surface. The flexible HDMI structure 10 is released or delaminated from the substrate 11 to expose a bottom surface of the structure 10 (the polyimide release layer 12). A laser may be used to drill or form vias (not shown) through the polyimide release layer 12 to expose the bottom set of bond pads 13a. Additional metal is then deposited in the vias and a bottom set of contact pads 18 are formed for the flexible HDMI structure 10 to which connections may be made.

Alternatively, the flexible HDMI structure 10 may be released from the substrate 11, and the release layer 12 removed to expose the bottom set of bond pads 13a. The exposed bond pads 13a are then processed to provide the bottom set of contact pads 18. This may be accomplished by depositing an additional polyimide layer, processing the additional polyimide layer to form vias that expose the bottom set of bond pads 13a, and depositing bottom contact pads 18 that contact the exposed bottom set of bond pads 13a to which connections may be made.

Referring to FIG. 2, a mounting substrate 23 is fabricated having relatively thick conductive (aluminum) lines 25 connected to bond pads 28 that are used to connect to the bottom contact pads 18 on the bottom surface of the HDMI structure 10. The relatively thick conductive lines 25 are part of a ground plane in a simple circuit embodying the HDMI structure 10, or connect to electrical circuits (not shown) on the mounting substrate 23 on a more complex circuit. Prior to the present invention, the relatively thick conductive lines 25 and bond pads 28 caused non-planarity of the top surface of the HDMI structure 10 which in many cases was unacceptable because it was difficult if not impossible to mount integrated circuit chips to the HDMI structure 10.

In order to alleviate this the problem, the carrier 21 is used and is bonded to the top surface of the protective layer 27 disposed on the flexible HDMI structure 10. The carrier 21 is relatively flat and planar and once bonded to the protective layer 27 and flexible HDMI structure 10 ensures that it remains flat during its interconnection to the mounting substrate 23. This in turn ensures that the top surface of the flexible HDMI structure 10 is flat enough to allow integrated circuit chips or die to be attached thereto. Consequently, use of the carrier 21 secured to the top surface of the protective film 26 on the HDMI structure 10 creates a flat, planar HDMI structure 10 which alleviates potential problems when mounting integrated circuit chips to the top surface thereof.

The mounting substrate 23 is secured to the bottom surface of the HDMI structure 10 by means of a relatively thick adhesive layer 24, for example, which may be an adhesive sheet containing conductive vias (not shown), for example, formed from solder that are used to interconnect the contact pads 18 to the conductive lines 25. Connection between the contact pads 18 and the conductive lines 25 may be achieved using a reflow process to melt the vias so that they connect the contact pads 18 to the conductive lines 25. The adhesive layer 24 or sheet may have a thickness on the order of one to ten mils.

Referring to FIG. 3, once the flat, planar HDMI structure 10 is secured to the mounting substrate 23 by way of the relatively thick adhesive layer 24, the contact pads 18 are interconnected to the bond pads 28 attached to the conductive lines 25, such as by reflow soldering, for example. Then the carrier 21 and adhesive layer 22 are removed to expose the protective film layer 26 disposed on top of the upper set of contact pads 17. The protective film layer 26 and the adhesive layer 27 serve to protect the top surface of the HDMI decal 10 until they are removed just prior to assembly. Because the top surface of the HDMI structure 10 is relatively flat and planar, it is much easier to connect integrated circuits to the upper set of contact pads 17.

For the purposes of completeness, FIGS. 4a and 4b show flow charts illustrating methods 30 in accordance with the principles of the present invention for fabricating high density multilayer interconnect structures 10 or flexible HDMI decals 10. FIG. 4a illustrates methods 30 for fabricating flexible HDMI decals 10 having both top and bottom contact pads, while FIG. 4b illustrates methods 30 for fabricating flexible HDMI decals 10 having only top contact pads.

Referring to FIG. 4a, the method 30 comprises the steps of fabricating 31 a flexible HDMI decal 10 having top and bottom contact pads 17, 18 on a rigid substrate 11. A protective film layer 26 is applied 32 using adhesive 27 to a top surface of the flexible HDMI decal 10.

Then, two alternative set of processing steps may be employed at this point. In the first approach, a carrier 21 having an adhesive layer 22 on one surface thereof is secured 33 to a top surface of the protective film layer 26. This step makes the top surface of the flexible HDMI decal 10 relatively flat and planar. Then, the substrate 11 upon which the flexible HDMI decal 10 was formed is removed 34 or delaminated 34. A mounting substrate 23 is processed 35 to form conductive bond pads 28 on a surface thereof that are used to connect to the bottom contact pads 18 of the flexible HDMI decal 10. The flexible HDMI decal 10 is then secured 36 to the mounting substrate 23 using a relatively thick adhesive layer 24 containing conductive regions corresponding to the bond pads 28 on the mounting substrate 23 and the bottom contact pads 18 of the flexible HDMI decal 10. The adhesive layer 24, may be an adhesive sheet containing conductive vias that are reflowed to interconnect the contact pads 18 to the conductive lines 25.

Alternatively, in the second approach, the substrate 11 upon which the flexible HDMI decal 10 was formed is removed 34 or delaminated 34. Then, the carrier 21 having an adhesive layer 22 on one surface thereof, for example, is secured 33 to a top surface of the protective film layer 26, which makes the top surface of the flexible HDMI decal 10 relatively flat and planar. The bottom set of contact pads is then processed. A mounting substrate 23 is processed 35 to form conductive bond pads 28 on a surface thereof that are used to connect to the bottom contact pads 18 of the flexible HDMI decal 10. The flexible HDMI decal 10 is then secured 36 to the mounting substrate 23 using a relatively thick adhesive layer 24 containing conductive regions corresponding to the bond pads 28 on the mounting substrate 23 and the bottom contact pads 18 of the flexible HDMI decal 10.

Then, after either of the above alternative set of steps is performed, the contact pads 18 on the bottom of the flexible HDMI decal 10 are electrically connected 37 to the bond pads 28 on the mounting substrate 23. This is achieved by using a reflow process, for example. Then, the carrier 21 and protective film layer 26 are removed 38 to expose the upper set of contact pads 17 of the flexible HDMI decal 10. The sprotective film layer 26 is typically removed just prior to populating the flexible HDMI decal 10. Integrated circuits and other electrical components are then attached 39 to the upper set of contact pads 17 to populate and complete the flexible HDMI decal 10.

Referring to FIG. 4b, the method 30 comprises the steps of fabricating 31' a flexible HDMI decal 10 having top contact pads 17 on a rigid substrate 11. A protective film layer 26 is applied 32 using adhesive 27 to a top surface of the flexible HDMI decal 10. Again, two alternative set of processing steps may be employed at this point.

A carrier 21 having an adhesive layer 22 on one surface thereof, for example, is secured 33 to a top surface of the protective film layer 26. This step makes the top surface of the flexible HDMI decal 10 relatively flat and planar. The substrate 11 upon which the flexible HDMI decal 10 was formed is then removed 34. A mounting substrate 23 is processed 35' that is used to mount the flexible HDMI decal 10. The flexible HDMI decal 10 is then secured 36' to the mounting substrate 23 using a relatively thick adhesive layer 24. The adhesive layer 24, may be an adhesive sheet containing conductive vias that are reflowed to interconnect the contact pads 18 to the conductive lines 25.

Alternatively, the substrate 11 upon which the flexible HDMI decal 10 was formed is removed 34. Then, a carrier 21 is secured 33 to a top surface of the protective film layer 26. A mounting substrate 23 is processed 35' that is used to mount the flexible HDMI decal 10. The flexible HDMI decal 10 is then secured 36' to the mounting substrate 23 using a relatively thick adhesive layer 24.

Then, after either of the above alternative set of steps is performed, the carrier 21 and protective film layer 26 are removed 38 to expose the upper set of contact pads 17 of the flexible HDMI decal 10. The protective film layer 26 is typically removed just prior to populating the flexible HDMI decal 10. Integrated circuits and other electrical components are then attached 39 to the upper set of contact pads 17 to populate and complete the flexible HDMI decal 10.

The present methods 30 provide significant benefits in the handling of HDMI decals 10 and in the subsequent assembly processes used to mount the decals 10. An advantage of the present invention is its ability to maintain the flatness of the top of the decal 10 to provide for connection of integrated circuit chips even when mounting the decal 10 on a non-planar surface or substrate 23. Additionally the present invention protects the top of the decal 10 from deleterious intrusion of mounting adhesive 24. The method 30 may be used with top contact HDMI decals 10 and to bottom contact HDMI decals 10.

In practicing the present invention, a flexible HDMI decal 10 was mounted to a non-planar printed wiring board employed as the mounting substrate 23 using the carrier 21 and adhesive layer 22 secured to the top surface thereof. After fabrication, the top surface of the decal 10 was flat and there was no bleedout of epoxy adhesive onto the decal which could interfere with wire bonds between the decal to the printed wiring board. Wire bond tests were made to evaluate the attached decal. These tests were identical to conventional HDMI substrate wire bond results.

Thus, methods of forming two-sided flexible HDMI decals comprising flexible fine line interconnect structures has been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A method of fabricating a high density multilayer interconnect structure comprising a flexible HDMI decal, said method comprising the steps of:

fabricating a flexible HDMI decal having an upper set of contact pads on a rigid substrate;

applying a protective film layer to a top surface of the flexible HDMI decal;

securing a carrier to a top surface of the protective film layer to make the top surface of the flexible HDMI decal relatively flat and planar;

removing the flexible HDMI decal from the substrate;

securing the flexible HDMI decal, the carrier and protective film layer to a mounting substrate;

removing the carrier and protective film layer to expose the upper set of contact pads of the flexible HDMI decal; and attaching integrated circuits and electrical components to the upper set of contact pads to complete the flexible HDMI decal.

2. The method of claim 1 wherein the step of removing the flexible HDMI decal from the substrate is performed prior to the step of securing the carrier to the top surface of the protective film layer.

3. The method of claim 1 wherein the flexible HDMI decal, the carrier and protective film layer are secured to the mounting substrate by means of an adhesive layer comprising an adhesive sheet containing conductive vias.

4. The method of claim 3 wherein the electrical components comprise integrated circuit die.

5. The method of claim 1 wherein the carrier is applied to the protective film layer using an adhesive layer.

6. The method of claim 1 wherein the protective film layer is applied to the top surface of the HDMI decal using an adhesive layer.

7. A method of fabricating a high density multi layer interconnect structure comprising a flexible HDMI decal, said method comprising the steps of:

fabricating a flexible HDMI decal having top and bottom contact pads on a rigid substrate;

applying a protective film layer to a top surface of the flexible HDMI decal;

securing a carrier to a top surface of the protective film layer to make the top surface of the flexible HDMI decal relatively flat and planar;

removing the flexible HDMI decal from the carrier;

securing the flexible HDMI decal, protective film layer and the carrier to a mounting substrate;

electrically connecting the bottom contact pads of the flexible HDMI decal to bond pads on the mounting substrate;

removing the carrier and protective film layer to expose an upper set of contact pads of the flexible HDMI decal; and attaching integrated circuits and electrical components to the upper set of contact pads to complete the flexible HDMI decal.

8. The method of claim 7 wherein the step of removing the flexible HDMI decal from the substrate is performed prior to the step of securing the carrier to the top surface of the protective film layer.

9. The method of claim 8 further comprising the steps of:

after removing the flexible HDMI decal from the carrier, processing the mounting substrate to form conductive bond pads on a surface thereof that are used to connect to the bottom contact pads of the flexible HDMI decal; and securing the flexible HDMI decal to the mounting substrate using an adhesive layer containing conductive regions corresponding to the bond pads on the mounting substrate and the bottom contact pads of the flexible HDMI decal.

10. The method of claim 9 wherein the adhesive layer is an adhesive sheet containing conductive vias.

11. The method of claim 7 wherein the electrical components comprise integrated circuit die.

12. The method of claim 7 wherein the step of electrically connecting the bottom contact pads of the flexible HDMI decal to the bond pads on the mounting substrate comprises the step of reflow soldering the contact pads on the bottom of the flexible HDMI decal to the bond pads on the mounting substrate.

* * * * *